(12) United States Patent
Kuwazawa (10) Patent No.: US 6,608,348 B2
(45) Date of Patent: Aug. 19, 2003

(54) NONVOLATILE SEMICONDUCTOR MEMORY ARRAY WITH SKEWED ARRAY ARRANGEMENT

(75) Inventor: Kazunobu Kuwazawa, Suwa (JP)

(73) Assignee: Seiko Epson Corporation, Tokyo (JP)

(*) Notice: Subject to any disclaimer, the term of this patent is extended or adjusted under 35 U.S.C. 154(b) by 119 days.

(21) Appl. No.: 09/799,633

(22) Filed: Mar. 7, 2001

(65) Prior Publication Data
US 2002/0017679 A1 Feb. 14, 2002

(30) Foreign Application Priority Data
Mar. 13, 2000 (JP) ........................................ 2000-068451

(51) Int. Cl.$^7$ ............................................. H01L 29/788
(52) U.S. Cl. ..................... 257/321; 257/314; 257/315; 257/316; 438/263; 438/264; 438/594
(58) Field of Search ................................. 257/314, 315, 257/316, 321; 438/201, 211, 257, 263, 264, 266, 594

(56) References Cited

U.S. PATENT DOCUMENTS 6,136,648 A * 10/2000 Oya ........................... 438/257
6,178,131 B1 * 1/2001 Ishikawa et al. ......... 365/225.7

FOREIGN PATENT DOCUMENTS

| JP | 7-147335 | 6/1995 |
| JP | 7-147336 | 6/1995 |
| JP | 7-202042 | 8/1995 |
| JP | 7-221204 | 8/1995 |

* cited by examiner

*Primary Examiner*—Nathan J. Flynn
*Assistant Examiner*—Scott R Wilson
(74) *Attorney, Agent, or Firm*—Oliff & Berridge, PLC (57) ABSTRACT

A semiconductor device comprises a memory cell array in which a plurality of nonvolatile semiconductor memory devices are arrayed in a row direction and a column direction. Each of the nonvolatile semiconductor memory devices includes a silicon semiconductor substrate, a floating gate disposed on the silicon semiconductor substrate through a gate insulating layer interposed therebetween, a second insulating layer disposed on the floating gate, and a control gate which is isolated from the floating gate and extends in the row direction. The nonvolatile semiconductor memory devices which are adjacent each other in the row direction are isolated by element isolation regions extending in the column direction. One of angles formed where a major axis direction of the floating gate in a planar configuration of the memory cell array intersects the column direction is an acute angle.

11 Claims, 5 Drawing Sheets

NONVOLATILE SEMICONDUCTOR MEMORY ARRAY WITH SKEWED ARRAY ARRANGEMENT

BACKGROUND OF THE INVENTION

1. Field of the Invention

The present invention relates to a nonvolatile semiconductor memory device. More particularly, the present invention relates to a split-gate nonvolatile semiconductor memory device.

2. Description of Related Art

Figure 4:
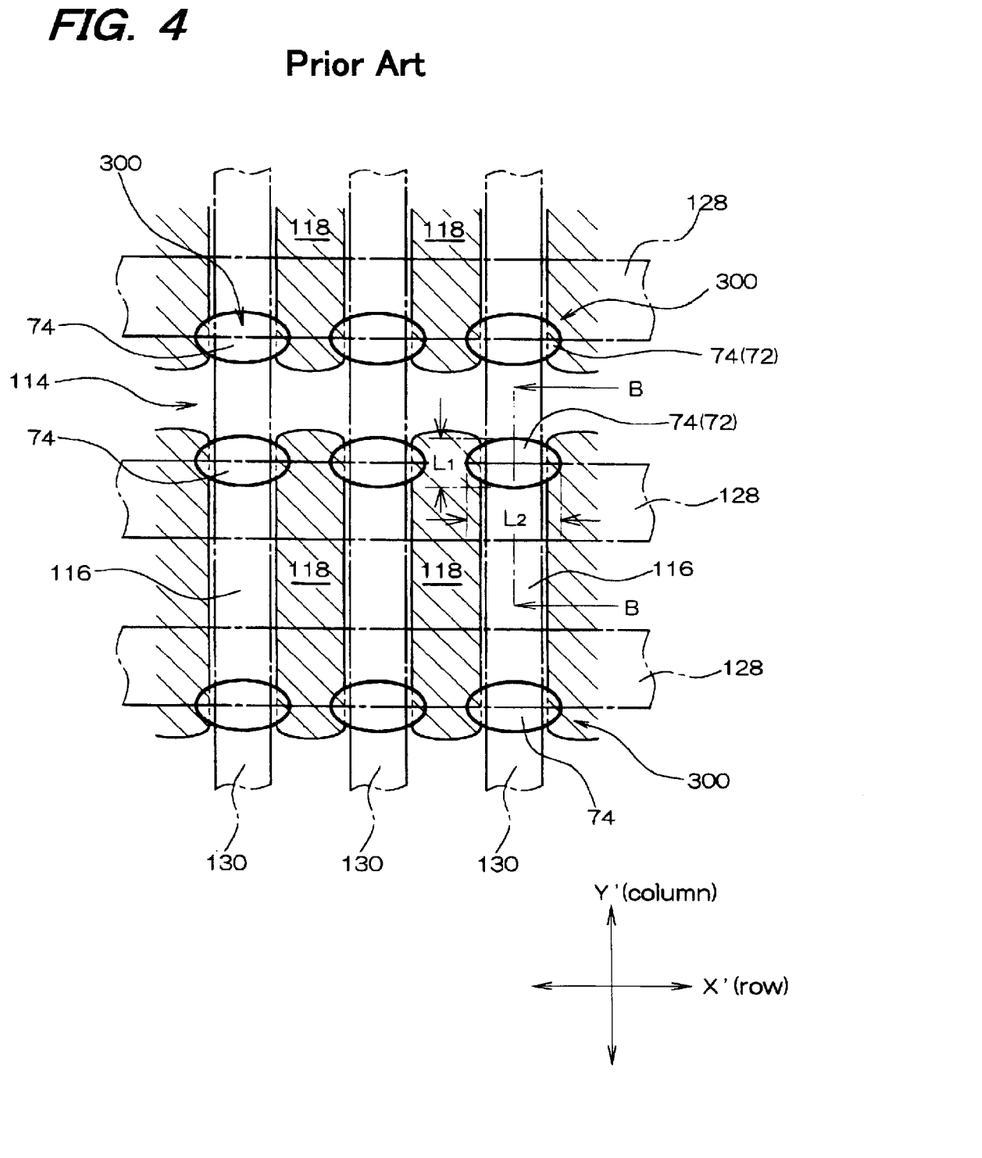
FIG. 4 is a plan view schematically showing an example of a typical semiconductor device.
Figure 5:
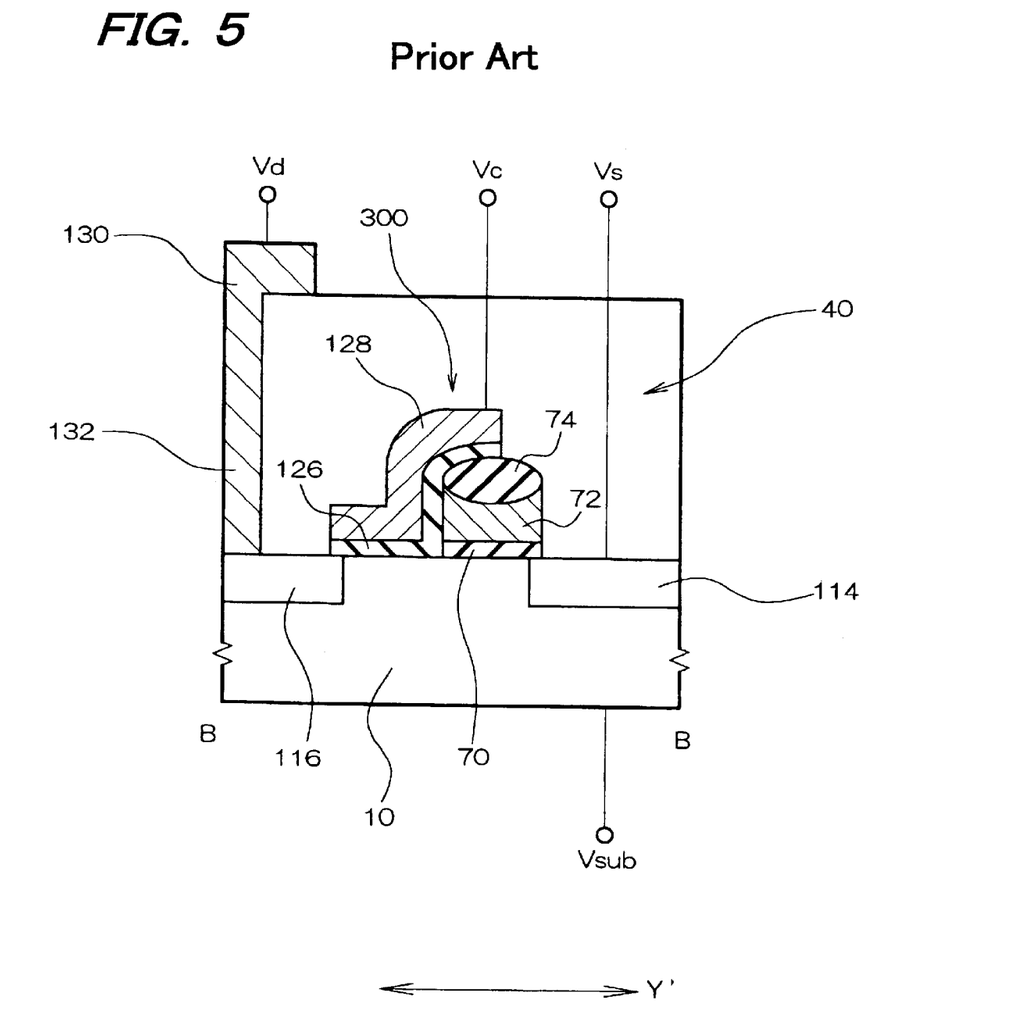
FIG. 5 is a cross-sectional view showing the semiconductor device shown in FIG. 4 along the line B—B.

Transistors having a split-gate structure are known as one type of device applied to an electrically erasable programmable ROM (EEPROM). FIG. 4 is a plan view schematically showing an example of a typical semiconductor device including nonvolatile semiconductor memory devices having a split-gate structure. FIG. 5 is a cross-sectional view along the line B—B shown in FIG. 4.

This semiconductor device includes nonvolatile semiconductor memory devices 300 having a split-gate structure (hereinafter called "memory transistor"). A memory cell array is formed by the memory transistor 300. The memory transistors 300 are arrayed in the X' direction (row direction) and the Y' direction (column direction) and isolated from one another by element isolation regions 118.

Taking an N-type transistor as an example, the memory transistor 300 has a source region 114 and a drain region 116 formed of $N^+$-type impurity diffusion layers which are formed in a P-type silicon substrate 10, and a gate insulating layer 70 formed on the silicon substrate 10, as shown in FIG. 5. A floating gate 72, a tunnel insulating layer 126, and a control gate 128 are formed on the gate insulating layer 70 in that order.

The floating gate 72 is independently disposed in each memory cell. The N-type source region 114 formed in the silicon substrate 10 is disposed between the floating gates 72 of the memory transistors 300 adjacent in the Y' direction. The N-type drain region 116 formed in the silicon substrate 10 is formed between two adjacent control gates 128. Upper insulating layers 74 are formed on the floating gates 72.

Operation of the split-gate memory transistor 300 is as follows. In the case of a data write operation, channel current is caused to flow between the source region 114 and the drain region 116, thereby injecting electric charges (hot electrons) into the floating gate 72. In the case of a data erase operation, a high voltage at a predetermined level is applied to the control gate 128, whereby the electric charges stored in the floating gate 72 are transferred to the control gate 128 through the tunnel insulating layer 126 by Fowler-Nordheim tunneling (FN tunneling).

In the case of a data read operation, the potential of the drain region 116 is set higher than that of the source region 114 to apply a predetermined voltage to the control gate 128, thereby determining written data by the presence or absence of formation of the channel. Specifically, if the electric charges are injected into the floating gate 72, a channel is not formed and current does not flow since the potential of the floating gate 72 becomes lower. On the contrary, if the electric charges are not injected into the floating gate 72, since the potential of the floating gate 72 becomes higher, a channel is formed and current flows. Data stored in the memory transistor 300 can be read out by detecting a current (cell current) flowing from the drain region 116 using a sense amplifier (not shown).

At present, an increase in the speed and integration of nonvolatile semiconductor memory devices is strongly demanded. As a method of increasing the speed and integration of nonvolatile semiconductor memory devices, there is a method of increasing the cell current flowing through each memory cell, thereby reducing the period of time for detecting the cell current using the sense amplifier. This enables data stored in the memory cell to be read out at higher speed.

For example, the semiconductor device shown in FIG. 4 is provided with the floating gates 72 of which the planar configuration is elliptical. In this case, the cell current can be increased by reducing the length $L_1$ of the axis (minor axis) of the floating gate 72 in the planar configuration in the direction parallel to the Y' direction, or increasing the length $L_2$ of the axis (major axis) of the floating gate 72 in the planar configuration in the direction parallel to the X' direction.

However, reducing the length $L_1$ of the minor axis causes the withstanding voltage between the source region 114 and the drain region 116 to be insufficient, whereby punch-through may occur.

On the other hand, increasing the length $L_2$ of the major axis results in an increase in the size of the planar configuration of the floating gate 72. As a result, an increase in the memory cell size is inevitable, thereby hindering higher device integration.

SUMMARY OF THE INVENTION

An object of the present invention is to provide a semiconductor device including nonvolatile semiconductor memory devices capable of an increase in the speed without increase in the memory cell size.

A semiconductor device of the present invention comprises a memory cell array in which a plurality of nonvolatile semiconductor memory devices are arrayed in a row direction and a column direction, wherein each of the nonvolatile semiconductor memory devices includes:

a semiconductor substrate;

a floating gate disposed on the semiconductor substrate through a first insulating layer which is capable of functioning as a gate insulating layer interposed therebetween;

a second insulating layer disposed on the floating gate;

a third insulating layer which is formed in contact with at least part of the floating gate and is capable of functioning as a tunnel insulating layer;

a control gate which is isolated from the floating gate by the third insulating layer and extends in the row direction; and impurity diffusion layers which are formed in the semiconductor substrate, forming a source region and a drain region, wherein the nonvolatile semiconductor memory devices which are adjacent to each other in the row direction are isolated by element isolations region extending in the column direction, and wherein one of angles formed where a major axis direction of the floating gates in a planar configuration of the memory cell array intersects the column direction is an acute angle.

The major axis direction is preferably the same as the row direction which is one of the directions in which the nonvolatile semiconductor memory devices are arrayed.

In a typical semiconductor device shown in FIGS. 4 and 5, a plurality of nonvolatile semiconductor memory devices are arrayed in the column direction and in the row direction which intersect at right angles.

In the semiconductor device of the present invention, one of the angles formed where the major axis direction intersects the column direction is an acute angle. Specifically, the one of the angles formed where the column direction intersects the row direction is an acute angle, and the floating gate may be formed so that the major axis direction is substantially parallel to the row direction. Because of this, cell current can be increased without increasing the memory cell size. This enables the speed of the nonvolatile semiconductor memory devices to be increased.

A longitudinal direction of each of the element isolation regions in the planar configuration of the memory cell array may be substantially parallel to the column direction. The longitudinal direction of the element isolation region in the planar configuration refers to the direction in which the element isolation regions extend on the semiconductor substrate for insulating the nonvolatile semiconductor memory devices adjacent in the row direction from each other.

It is preferable that, each of the element isolation regions is separately formed by every two rows of the nonvolatile semiconductor memory devices, one impurity diffusion layer which forms the source region or the drain region is separated in the row direction by the element isolation region, and the other the impurity diffusion layer which forms the drain region or the source region is formed continuously in the row direction. In this case, the other impurity diffusion layer may extend in the row direction.

DESCRIPTION OF PREFERRED EMBODIMENTS OF THE INVENTION

Figure 1:
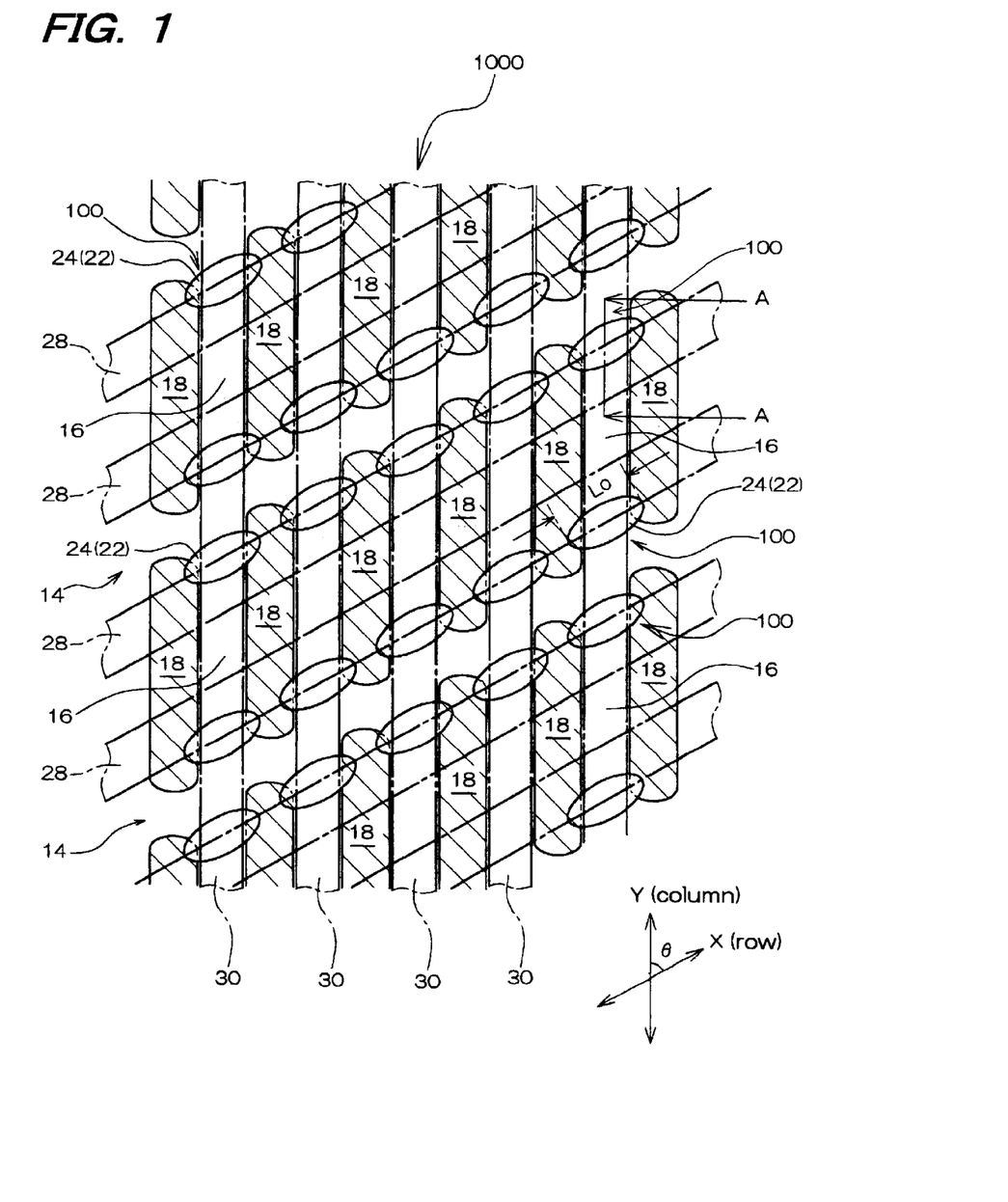
FIG. 1 is a plan view schematically showing a semiconductor device according to the present invention.
Figure 2:
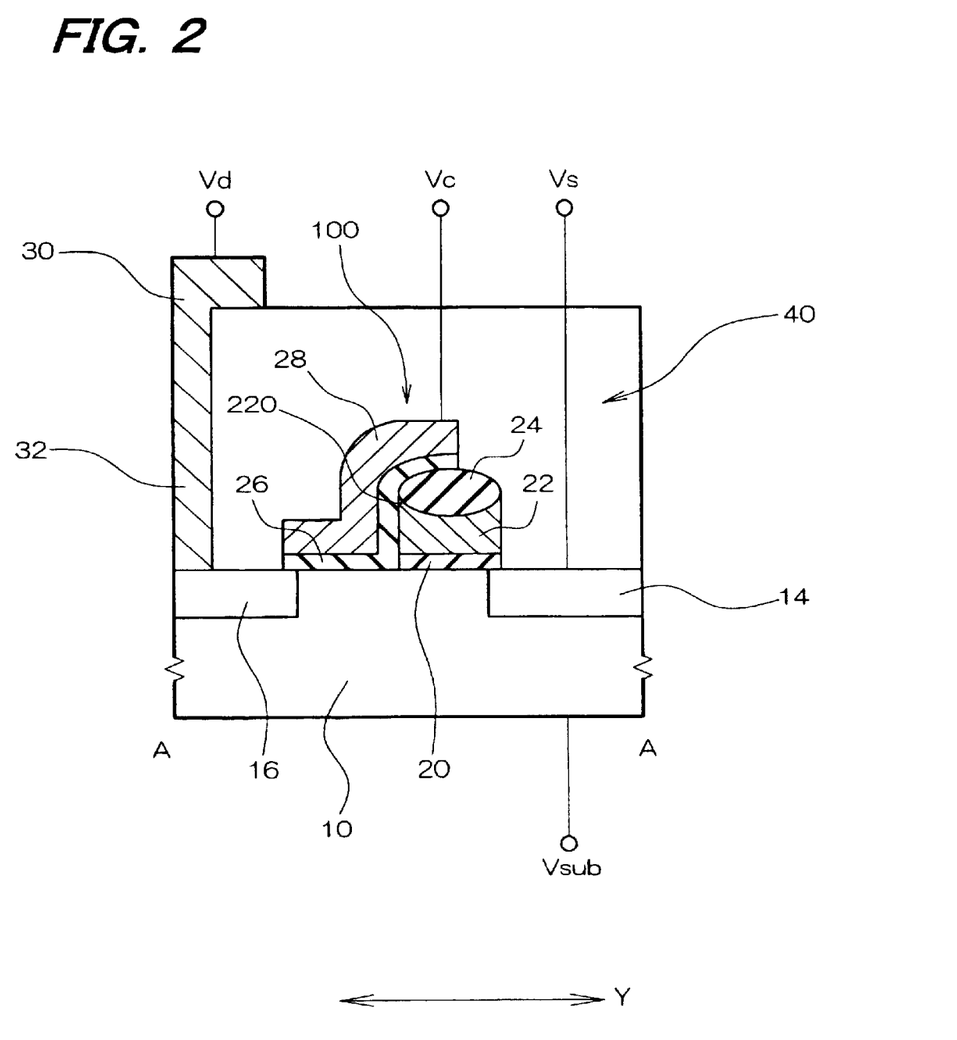
FIG. 2 is a cross-sectional view showing the semiconductor device shown in FIG. 1 along the line A—A.
Figure 3:
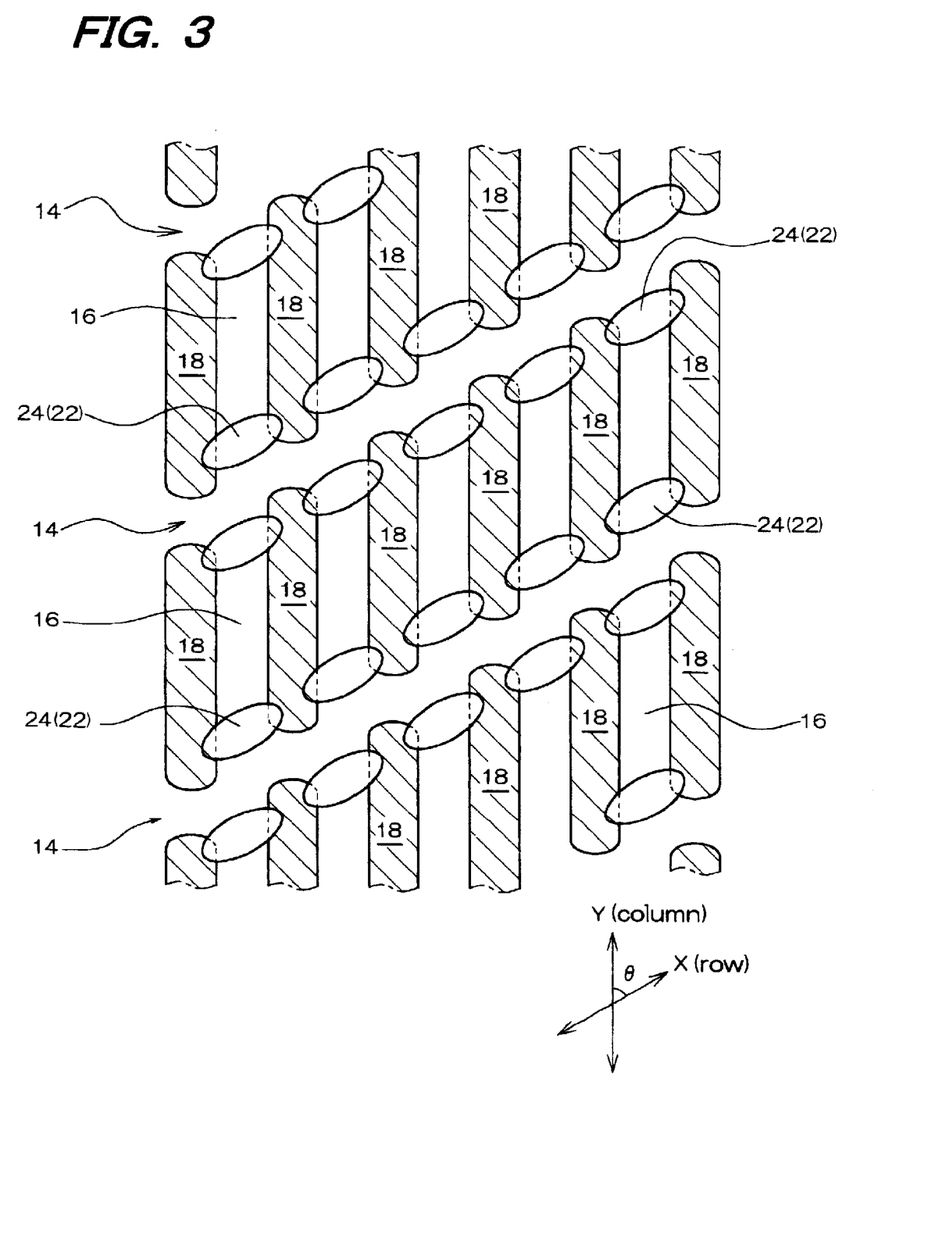
FIG. 3 is a plan view of a wafer showing a manufacturing step of the semiconductor device shown in FIG. 1.

Preferred embodiments of the present invention will be described below with reference to drawings.
Device Structure FIG. 1 is a plan view schematically showing a semiconductor device according to the present embodiment. FIG. 2 is a cross-sectional view showing the semiconductor device shown in FIG. 1 along the line A—A. FIG. 3 is a plan view of a wafer showing a manufacturing step of the semiconductor device shown in FIG. 1.

A semiconductor device 1000 according to the present embodiment includes nonvolatile semiconductor memory devices 100 having a split-gate structure (hereinafter may be called "memory transistor"). A memory cell array is formed by the memory transistors 100. In this memory cell array, the memory transistors 100 are arrayed in the X-direction (row direction) and in the Y-direction (column direction), as shown in FIG. 1. The adjacent memory transistors 100 in the X-direction are isolated by element isolation regions 18. Each memory transistor 100 is adjacent to another memory transistor 100 in the Y-direction through a drain region 16 interposed therebetween, and is also adjacent to another memory transistor 100 through a common source region 14 interposed therebetween.

The element isolation regions 18 are formed in the area in which two adjacent memory transistors 100 are formed in the Y-direction through the drain region 16 from the end of one memory transistor 100 to the end of the other memory transistor 100. In the semiconductor device 1000 shown in FIG. 1, each of the element isolation regions 18 is separately formed by every two rows of the memory transistors 100. The drain regions 16 are isolated in each memory cell by the element isolation regions 18 in the X-direction. The source regions 14 are formed of impurity diffusion layers which are continuously formed in the X-direction.

Taking an N-type transistor as an example, each of the memory transistors 100 has the source region 14 and the drain region 16 formed of $N^+$-type impurity diffusion layers which are formed in a P-type silicon substrate 10, and a gate insulating layer 20 (first insulating layer) formed in the silicon substrate 10, as shown in FIG. 2. A floating gate 22, a third insulating layer 26, and a control gate 28 are formed on the gate insulating layer 20 in that order.

The floating gate 22 is independently disposed for each memory cell. The control gates 28 extend in the X-direction so as to planarly overlap with at least part of a plurality of the floating gates 22 in each row. The N-type drain regions 16 are formed between the adjacent control gates 28. The drain regions 16 are formed in the silicon substrate 10. The N-type source regions 14 are formed in the memory transistors 100 in the area opposite to the drain regions 16. The source regions 14 are formed in the silicon substrate 10 in the same manner as the drain regions 16. The source regions 14 are formed of layers continuously formed in the X-direction and extend in the X-direction.

A second insulating layer 24 is formed on the floating gate 22. The second insulating layer 24 is formed by patterning an insulating layer formed on part of a polysilicon layer which is the floating gate 22 by selective oxidation, as described later. The second insulating layer 24 has a structure in which the thickness decreases toward the end, as shown in FIG. 2. Because of this, an upper edge 220 of the floating gate 22 has an acute angle, whereby electric field concentration easily occurs at the upper edge 220.

The gate insulating layers 20, floating gates 22, and second insulating layers 24 are formed so that each end overlaps with the adjacent element isolation regions 18, as shown in FIG. 1.

A feature of the present invention is that the angle θ formed where the major axis direction of the floating gates 22 in the planar configuration intersects the Y-direction (column direction) is an acute angle, as indicated by the example shown in FIG. 1. If the angle θ is an acute angle, the effective channel length can be increased with the cell size increased to a small extent, whereby the length $L_0$ of the floating gates 22 in the planar configuration in the major axis direction can be increased. As a result, since the cell current flowing through each memory cell can be increased without increasing the cell size, the period of time required for detecting the cell current using a sense amplifier can be reduced. This enables data stored in the memory cell to be read out at higher speed. In the present invention, the angle θ formed where the major axis direction of the floating gates 22 in the planar configuration intersects the Y-direction (column direction) refers to smaller angles among the angles formed when the major axis direction of the floating gates 22 in the planar configuration intersects the Y-direction (column direction)

It is preferable that the major axis direction of the floating gates 22 in the planar configuration be substantially parallel to the X-direction (row direction). In this case, the angle θ formed where the major axis direction of the floating gates 22 in the planar configuration intersects the Y-direction is equal to the angle θ formed where the X-direction intersects the Y-direction. According to this configuration, the planar configuration of the memory transistors 100 can be periodically arrayed, thereby preventing the memory size from increasing.

The third insulating layer 26 is formed from the upper side of the second insulating layer 24 to the side of the floating gate 22 and extends to one end of the drain region 16 along the surface of the silicon substrate 10. The third insulating layer 26 functions as a tunnel insulating layer.

An interlayer dielectric 40 is formed on a wafer on which the memory transistors 100 are formed, as shown in FIG. 2. Contact holes reaching predetermined regions, for example, the drain region 16 are formed in the interlayer dielectric 40. Contact conductive layers 32 are formed in the contact holes. A wiring layer 30 with a predetermined pattern is formed on the interlayer dielectric 40. The control gates 28 function as word lines and the source regions 14 extending parallel to the control gates 28 function as source lines. The wiring layers 30 connected to the drain regions 16 function as bit lines.

According to the semiconductor device 1000 described above, since the angle θ formed where the major axis direction of the floating gates 22 in the planar configuration intersects the Y-direction (column direction) is an acute angle, the length $L_0$ of the floating gates 22 in the planar configuration in the major axis direction can be increased without increasing the memory cell size. As a result, cell current flowing through each memory cell can be increased, whereby the period of time required for detecting the cell current using a sense amplifier can be reduced. Therefore, the structure of the semiconductor device of the present invention is extremely advantageous in increasing the speed of the memory cell without increasing the memory cell size.

Moreover, since the major axis direction of the floating gates 22 in the planar configuration is substantially parallel to the X-direction (row direction), the memory transistors 100 can be arrayed orderly, thereby preventing the memory size from increasing.

Operation of Memory Cell

Examples of operation of the memory transistor 100 constituting the semiconductor device according to the present embodiment are described below with reference to FIG. 2.

In FIG. 2, Vc indicates a voltage applied to the control gate 28, Vs indicates a voltage applied to the source region 14, Vd indicates a voltage applied to the drain region 16, and Vsub indicates a voltage applied to the P-type silicon substrate 10.

In the case of a data write operation, the split-gate memory transistor 100 is operated by causing channel current to flow between the source region 14 and the drain region 16, thereby injecting electric charges (hot electrons) into the floating gate 22. In the case of a data erase operation, a high voltage at a predetermined level is applied to the control gate 28, whereby the electric charges are transferred to the control gate 28 by FN tunneling. Examples of each operation are described below.

First, the data write operation is described.

In the data write operation, the potential of the drain region 16 is set higher than that of the source region 14 to apply a predetermined voltage to the control gate 28. This causes hot electrons generated near the drain region 16 to be accelerated towards the floating gate 22 and to be injected into the floating gate 22 through the gate insulating layer 20, whereby data is written in.

In the data write operation, the potential (Vc) of the control gate 28 is set at 1.8 V, the potential (Vs) of the source region 14 is set at 0 V, and the potential (Vd) of the drain region 16 is set at 10.5 V. The potential (Vsub) of the silicon substrate 10 is set at 0 V.

Next, the data erase operation is described.

In the data erase operation, the potential of the control gate 28 is set higher than the potentials of the source region 14 and the drain region 16. This causes the electric charges stored in the floating gate 22 to be released from the upper edge 220 of the floating gate 22 to the control gate 28 through the third insulating layer 26 by FN tunneling, whereby the data is erased.

In the data erase operation, the potential (Vc) of the control gate 28 is set at 11.5 V, the potentials (Vs) and (Vd) of the source region 14 and the drain region 16 are set at 0 V, and the potential (Vsub) of the silicon substrate 10 is set at 0 V.

Next, the data read operation is described.

In the data read operation, the potential of the drain region 16 is set higher than the source region 14 and a predetermined voltage is applied to the control gate 28, thereby determining written data by the presence or absence of formation of a channel. Specifically, if the electric charges are injected into the floating gate 22, since the potential of the floating gate 22 becomes lower, a channel is not formed and cell current does not flow. On the contrary, if the electric charges are not injected into the floating gate 22, since the potential of the floating gate 22 becomes higher, a channel is formed and current flows. Data stored in the memory transistor 100 can be read out by detecting the current (cell current) flowing from the drain region 16 using a sense amplifier.

In the data read operation, the potential (Vc) of the control gate 28 is set at 1.0 V, the potential (Vs) of the source region 14 is set at 0 V, the potential (Vd) of the drain region 16 is set at 3.0 V, and the potential (Vsub) of the silicon substrate 10 is set at 0 V.

Device Manufacturing Method

An example of a method of fabricating the semiconductor device shown in FIGS. 1 and 2 is described with reference to FIGS. 1 to 3.

(1) Field insulating layers (element isolation regions) 18 are formed in predetermined regions of the silicon substrate 10 using selective oxidation, shallow trench isolation (STI), or the like. Silicon oxide layers (not shown) are formed on the silicon substrate 10 using heat oxidation, for example. These silicon oxide layers become the gate insulating layers 20 (see FIG. 2) of the memory transistors 100. There are no specific limitations to the thickness of the silicon oxide layers. The thickness is preferably 7 nm to 8 nm in view of gate withstanding voltage and the like.

Then, polysilicon layers are formed on the surfaces of the silicon oxide layers using CVD, for example. Phosphorus or arsenic is diffused into the polysilicon layers, thereby forming N-type polysilicon layers (not shown). These polysilicon layers become the floating gates 22 (see FIG. 2) of the memory transistors 100. The thickness of the polysilicon layers is 100 nm to 150 nm, for example.

As other methods of making the polysilicon layers N-type, a method of injecting phosphorus or arsenic ions after forming the polysilicon layers, a method of introducing carrier gas containing phosphoryl chloride ($POCl_3$) after forming the polysilicon layers, a method of introducing carrier gas containing phosphine ($PH_3$) when forming the polysilicon layers, and the like can be given.

Then, silicon nitride layers (not shown) are formed on the polysilicon layers using CVD, and resist layers (not shown) are formed on the silicon nitride layers. Predetermined regions of the silicon nitride layers are removed by selective etching using the resist layers as masks. The second insulating layers 24 (see FIG. 2) of the memory transistors 100 are formed in the regions in which the silicon nitride layers are removed in a step described later. The resist layers are then removed.

(2) The second insulating layers 24 are formed in the predetermined regions of the polysilicon layers by selectively oxidizing the exposed areas of the polysilicon layers. The second insulating layers 24 formed by selective oxidation have a cross-sectional structure in which the thickness decreases from the center toward both ends, as shown in FIG. 2. The silicon nitride layers are then removed.

(3) The polysilicon layers and the silicon oxide layers are patterned by etching using the second insulating layers 24 as masks. The floating gates 22 and the gate insulating layers 20 shown in FIG. 2 are formed by this step.

As a result of the steps (1) to (3), the floating gates 22 and the second insulating layers 24 are formed so that the angle θ formed where the major axis direction of the floating gates 22 in the planar configuration intersects the Y-direction is an acute angle, as shown in FIG. 3. The element isolation regions 18 for isolating the memory transistors 100 of which the longitudinal direction is parallel to the Y-direction are also formed.

(4) Silicon oxide layers (not shown) are then formed on the wafer. These silicon oxide layers become the third gate insulating layers 26 (see FIG. 2) of the memory transistors 100. As a method of forming the silicon oxide layers, heat oxidation, CVD, and the like can be employed. Among CVDs, high-temperature heat CVD is preferable. A fine silicon oxide layer can be formed by forming the silicon oxide layers using high-temperature heat CVD. The thickness of the silicon oxide layers formed on the silicon substrate 10 is 20 nm to 25 nm, for example. The silicon oxide layers may be formed of a plurality of laminated layers.

(5) The silicon oxide layers are then annealed, as required. Annealing improves the film properties of the silicon oxide layers. The silicon oxide layers may be annealed in nitrogen atmosphere under ordinary pressure, for example. The annealing temperature is 850° C. to 1000° C., and preferably 900° C. to 950° C. The annealing time is 15 minutes to 30 minutes, and preferably 20 minutes to 25 minutes.

(6) Then, polysilicon layers (not shown) are formed on the silicon oxide layers using the method described in the step (1).

Resist layers (not shown) with a predetermined pattern are formed on the polysilicon layers and patterned by etching, thereby forming the third insulating layers 26 and the control gates 28 (see FIG. 2) of the memory transistors 100.

(7) After forming resist layers (not shown) patterned so as to cover part of the second insulating layers 24, control gates 28, and regions in which the drain regions 16 are formed, the silicon substrate 10 is doped with N-type impurities by a conventional method using the resist layers as masks, thereby forming the impurity diffusion layers which form the source regions 14.

After forming resist layers (not shown) patterned so as to cover the second insulating layers 24, control gates 28, and source regions 14, the silicon substrate 10 is doped with N-type impurities, thereby forming the drain regions 16.

The memory transistors 100 shown in FIG. 1 are formed by these steps.

(8) The interlayer dielectric 40 (see FIG. 2) formed of a silicon oxide layer is formed on the wafer on which the memory transistors 100 are formed using CVD, for example. Predetermined regions of the interlayer dielectric 40 are removed by selective etching, thereby forming the contact holes reaching the drain regions 16. Then, the conductive layers formed of aluminum or the like are deposited on the upper side of the interlayer dielectric 40 and in the contact holes by sputtering. The conductive layers are patterned to form the contact conductive layers 32 and the metal wiring layers 30 (bit lines or source lines which are not shown in Figures, for example). The metal wiring layers 30 are electrically connected to the impurity diffusion layers (drain regions 16 or source regions 14) through the contact conductive layers 32.

The present invention is not limited to the above embodiment. Further modifications and variations are possible within the scope of the present invention.

For example, the present embodiment illustrates the case where the planar configuration of the floating gates 22 is substantially elliptical. The planar configuration of the floating gates 22 is not limited to this.

The present embodiment is illustrated using N-type transistors as example. The action and effects can be achieved in the case of P-type transistors.

As required, a triple-well structure in which an N-type first well is formed by diffusing N-type impurities (for example, arsenic or phosphorus) into the silicon substrate 10 and a P-type second well is formed in a predetermined region by doping the first well with P-type impurities (for example, boron) may be used.

What is claimed is:

1. A semiconductor device comprising a memory cell array in which a plurality of nonvolatile semiconductor memory devices are arrayed in a row direction and a column direction,
    wherein each of the nonvolatile semiconductor memory devices is capable of carrying a cell current and includes:
        a semiconductor substrate;
        a floating gate having a major axis disposed on the semiconductor substrate through a first insulating layer which is capable of functioning as a gate insulating layer interposed therebetween;
        a second insulating layer disposed on the floating gate;
        a third insulating layer which is formed in contact with at least part of the floating gate and is capable of functioning as a tunnel insulating layer;
        a control gate which is isolated from the floating gate by the third insulating layer and extends in the row direction; and
        impurity diffusion layers which are formed in the semiconductor substrate, forming a source region and a drain region,
    wherein the nonvolatile semiconductor memory devices which are adjacent to each other in the row direction are isolated by element isolations region extending in the column direction, and
    wherein one of angles formed where a major axis direction of the floating gates in a planar configuration of the memory cell array intersects the column direction is an acute angle, whereby the cell currents may be increased without enlarging the memory cell array.

2. The semiconductor device according to claim 1,
    wherein the major axis direction is substantially parallel to the row direction.

3. The semiconductor device according to claim 1, wherein an angle formed where the row direction intersects the column direction is substantially equal to an angle formed where the major axis direction intersects the column direction.

4. The semiconductor device according to claim 1, wherein a longitudinal direction of each of the element isolation regions in the planar configuration of the memory cell array is substantially parallel to the column direction.

5. The semiconductor device according to claim 1, wherein each of the element isolation regions is separately formed by every two rows of the nonvolatile semiconductor memory devices, wherein one impurity diffusion layer which forms the source region or the drain region is separated in the row direction by the element isolation region, and wherein the other impurity diffusion layer which forms the drain region or the source region is formed continuously in the row direction.

6. The semiconductor device according to claim 5, wherein the other of the impurity diffusion layers extends in the row direction.

7. A semiconductor device comprising a memory cell array in which a plurality of nonvolatile semiconductor memory devices are arrayed in a row direction and a column direction, wherein each of the nonvolatile semiconductor memory devices includes:

a semiconductor substrate;

a floating gate disposed on the semiconductor substrate through a first insulating layer which is capable of functioning as a gate insulating layer interposed therebetween;

a second insulating layer disposed on the floating gate;

a third insulating layer which is formed in contact with at least part of the floating gate and is capable of functioning as a tunnel insulating layer;

a control gate which is isolated from the floating gate by the third insulating layer and extends in the row direction; and impurity diffusion layers which are formed in the semiconductor substrate, forming a source region and a drain region, wherein the nonvolatile semiconductor memory devices which are adjacent to each other in the row direction are isolated by element isolations region extending in the column direction, wherein one of angles formed where a major axis direction of the floating gates in a planar configuration of the memory cell array intersects the column direction is an acute angle, wherein each of the element isolation regions is separately formed by every two rows of the nonvolatile semiconductor memory devices, wherein one impurity diffusion layer which forms the source region or the drain region is separate in the row direction by the element isolation region, and wherein the other impurity diffusion layer which forms the drain region or the source region is formed continuously in the row direction.

8. The semiconductor device according to claim 7, wherein the major axis direction is substantially parallel to the row direction.

9. The semiconductor device according to claim 7, wherein an angle formed where the row direction intersects the column direction is substantially equal to an angle formed where the major axis direction intersects the column direction.

10. The semiconductor device according to claim 7, wherein a longitudinal direction of each of the element isolation regions in the planar configuration of the memory cell array is substantially parallel to the column direction.

11. The semiconductor device according to claim 7, wherein the other of the impurity diffusion layers extends in the row direction.

* * * * *